(12) United States Patent
Srinivasa et al.

(10) Patent No.: US 9,647,676 B2
(45) Date of Patent: May 9, 2017

(54) METHOD AND APPARATUS FOR REDUCING SAR INPUT LOADING

(71) Applicant: TEXAS INSTRUMENTS INCORPORATED, Dallas, TX (US)

(72) Inventors: Raghu Nandan Srinivasa, Bangalore (IN); Tharun Nagulu, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/206,433

(22) Filed: Jul. 11, 2016

(65) Prior Publication Data

US 2016/0336952 A1 Nov. 17, 2016

Related U.S. Application Data

(63) Continuation of application No. 14/871,475, filed on Sep. 30, 2015, now Pat. No. 9,391,627.

(51) Int. Cl.

| H03M 1/06 | (2006.01) |
|---|---|
| H03M 1/12 | (2006.01) |
| G06F 1/32 | (2006.01) |
| G06F 13/40 | (2006.01) |
| H03M 1/38 | (2006.01) |
| H03M 1/00 | (2006.01) |
| H03M 1/80 | (2006.01) |
| H03M 1/46 | (2006.01) |

(52) U.S. Cl.
CPC .......... *H03M 1/124* (2013.01); *G06F 1/3287* (2013.01); *G06F 13/4022* (2013.01); *H03M 1/1245* (2013.01); *H03M 1/38* (2013.01); *H03M 1/466* (2013.01); *H03M 1/00* (2013.01); *H03M 1/12* (2013.01); *H03M 1/468* (2013.01); *H03M 1/804* (2013.01)

(58) Field of Classification Search
CPC ........... H03M 1/00; H03M 1/12; H03M 1/804
USPC ......................... 341/118, 110, 172, 155, 156
See application file for complete search history.

(56) References Cited

U.S. PATENT DOCUMENTS

| 6,747,589 B2 | 6/2004 | Srinivasan et al. |
|---|---|---|
| 2012/0280841 A1 | 11/2012 | Wang |
| 2015/0188561 A1* | 7/2015 | Narayan ............. H03M 1/0604 341/118 |

* cited by examiner

*Primary Examiner* — Joseph Lauture
(74) *Attorney, Agent, or Firm* — John R. Pessetto; Charles A. Brill; Frank D. Cimino (57) ABSTRACT

The disclosure provides a successive approximation register analog to digital converter (SAR ADC). The SAR ADC includes a charge sharing DAC that includes an array of MSB (most significant bit) capacitors, an array of LSB (least significant bit) capacitors, and an error correction capacitor. A zero crossing detector is coupled to the charge sharing DAC. The zero crossing detector generates a digital output. A successive approximation register (SAR) state machine is coupled to the zero crossing detector and operates the charge sharing DAC in a sampling mode and a conversion mode. During the sampling mode an input voltage is provided to the array of MSB capacitors and the error correction capacitor.

20 Claims, 4 Drawing Sheets

METHOD AND APPARATUS FOR REDUCING SAR INPUT LOADING

CROSS REFERENCES TO RELATED APPLICATIONS

This continuation application claims priority to U.S. patent application Ser. No. 14/871,475, filed Sep. 30, 2015, which application claims priority from India provisional patent application No. 2469/CHE/2015, filed May 15, 2015, both of which are hereby incorporated by reference in their entirety.

TECHNICAL FIELD

The present disclosure is generally related to a successive approximation register analog to digital converter (SAR ADC) and more particularly to reducing input loading in a SAR ADC.

BACKGROUND

A pipeline ADC (analog to digital converter) is generally preferred to achieve a speed of 100 MSPS (mega samples per second) in high speed applications. However in recent years, with the advent of UDSM (ultra deep sub micron) technologies and improved capacitor matching techniques, successive approximation register analog to digital converter (SAR ADC) is a fast emerging alternative to the pipeline ADCs. The fact that pipelined ADCs require active amplifiers which comes at the cost of high power makes SAR ADCs a good architectural choice as its static power requirement is limited to a zero crossing detector which consumes a low power.

In an N-bit SAR ADC, the analog to digital conversion is done serially and hence requires N steps. Thus, a SAR ADC seeking to produce a 10 bit output has to perform 10 bit trials. Therefore, the SAR ADCs are inherently slow. In high speed applications, for example application at 100 MSPS throughput with 10 bit resolution, the SAR ADC is required to operate at 1 GHz. However, the SAR ADC has inherent problems. These problems include capacitive loading and charge kick back. The capacitive loading is caused by parasitic capacitances. The parasitic capacitances are created by switches and capacitors used in the SAR ADC. The charge kick back is caused by capacitors in the SAR ADC. An input driver provides an input voltage to the SAR ADC. The capacitors kick back a non-linear charge into the input driver, and this non-linear charge is required to be settled in a sampling time of the input voltage.

SUMMARY

According to an aspect of the disclosure, a successive approximation register analog to digital converter (SAR ADC) is disclosed. The SAR ADC includes a charge sharing DAC that includes an array of MSB (most significant bit) capacitors, an array of LSB (least significant bit) capacitors, and an error correction capacitor. A zero crossing detector is coupled to the charge sharing DAC. The zero crossing detector generates a digital output. A successive approximation register (SAR) state machine is coupled to the zero crossing detector and operates the charge sharing DAC in a sampling mode and a conversion mode. During the sampling mode an input voltage is provided to the array of MSB capacitors and the error correction capacitor.

DETAILED DESCRIPTION OF THE EMBODIMENTS

Figure 1:
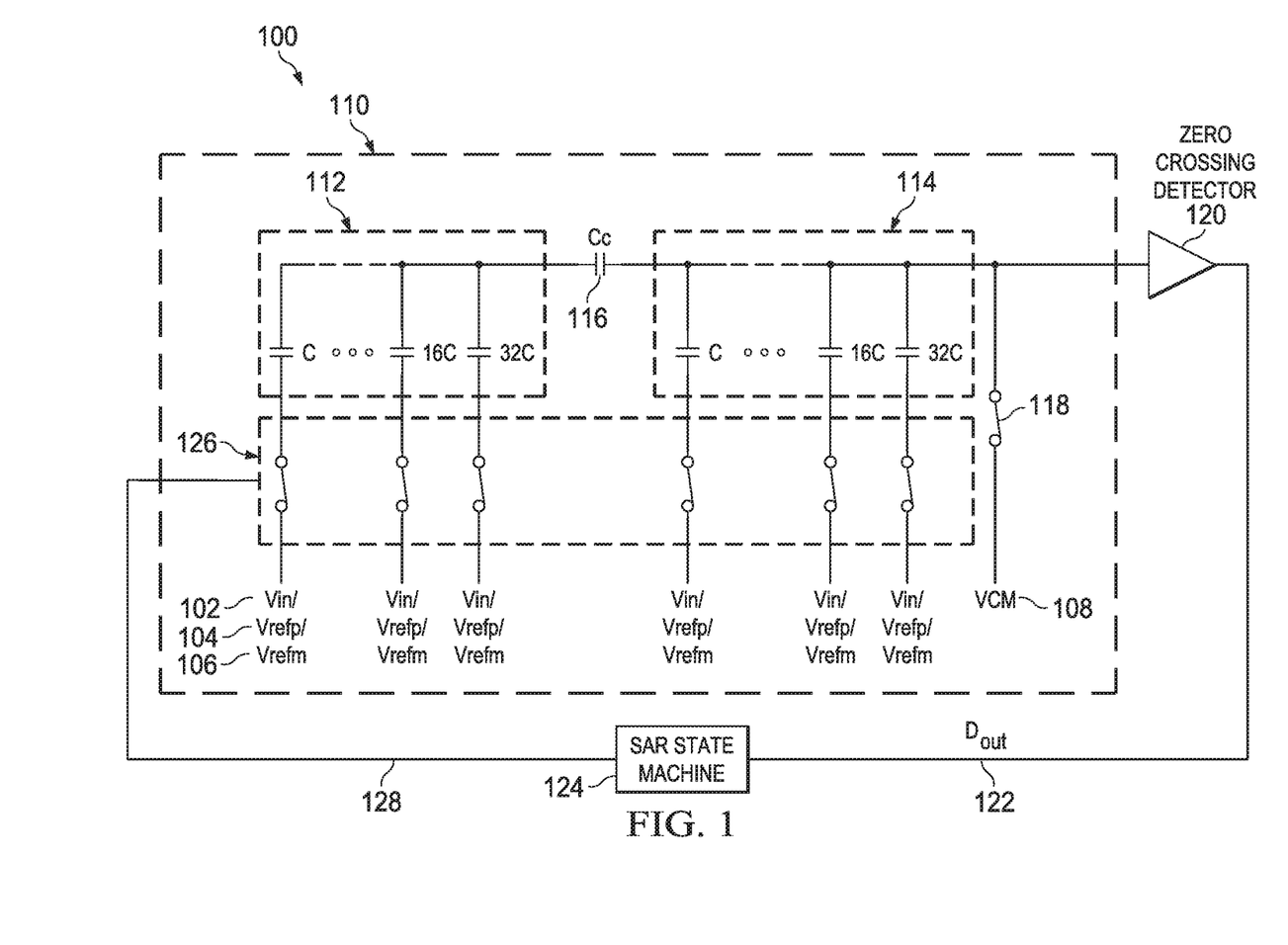
FIG. 1 illustrates a schematic of a successive approximation register analog to digital converter (SAR ADC)

FIG. 1 illustrates a schematic of a successive approximation register analog to digital converter (SAR ADC) 100. The SAR ADC 100 is one of a single ended SAR ADC and a differential SAR ADC. The SAR ADC 100 includes a charge sharing (digital to analog converter) DAC 110, a zero crossing detector 120 and a (successive approximation register) SAR state machine 124. The charge sharing DAC 110 includes an array of MSB (most significant bit) capacitors 114, an array of LSB (least significant bit) capacitors 112, a coupling capacitor Cc 116, a top plate switch 118 and a plurality of switches 126.

Each switch of the plurality of switches 126 receives an input voltage Vin 102, a positive reference voltage Vrefp 104 and a negative reference voltage Vrefm 106. An input driver, in one example, provides the input voltage Vin 102, and a reference driver provides the positive reference voltage Vrefp 104 and the negative reference voltage Vrefm 106. Each capacitor in the array of MSB capacitors 114 and the array of LSB capacitors 112 is coupled to a switch of the plurality of switches. The coupling capacitor Cc 116 is coupled between the array of LSB capacitors 112 and the array of MSB capacitors 114.

The top plate switch 118 receives a common mode voltage Vcm 108. The top plate switch 118 is coupled to the zero crossing detector 120. The top plates of the array of MSB capacitors 114 are also coupled to the zero crossing detector 120. The SAR state machine 124 is coupled to the zero crossing detector 120. The plurality of switches 126 are coupled to the SAR state machine 124.

The operation of the SAR ADC 100 illustrated in FIG. 1 is explained now. The SAR state machine 124 generates a plurality of control signals 128 which controls the plurality of switches 126. Each control signal of the plurality of control signals 128 activates a switch of the plurality of switches. Each switch of the plurality of switches 126 receives a control signal of the plurality of control signals 128 from the SAR state machine 124. Thus, each switch when activated by a control signal provides one of the input voltage Vin 102, the positive reference voltage Vrefp 104 and the negative reference voltage Vrefm 106 to a corresponding capacitor coupled to the switch.

The plurality of control signals 128 operate the charge sharing DAC in a sampling mode and a conversion mode. In the sampling mode, the top plate switch 118 is activated (closed). Thus, top plates of the array of MSB capacitors 114 are coupled to the common mode voltage Vcm 108. The SAR state machine 124 generates the plurality of control signals 128 which couple bottom plates of the array of MSB capacitors 114, and bottom plates of the array of LSB capacitors 112 to the input voltage Vin 102.

The conversion mode is explained now. In the conversion mode, SAR ADC 100 finds a digital output Dout 122 equivalent to the input voltage Vin 102 using a binary search technique. The capacitors in the array of MSB capacitors 114 and in the array of LSB capacitors 112 are binary weighted capacitors. For example, a capacitance of the capacitors in each of the array of MSB capacitors 114 and the array of LSB capacitors are 32c, 16C and so on to C. The binary search technique includes multiple cycles. In a first cycle, of the multiple cycles, the top plate switch 118 is inactivated. The SAR state machine 124 generates the plurality of control signals 128 which couple bottom plates of the array of MSB capacitors 114 and bottom plates of the array of LSB capacitors 112 to one of the positive reference voltage Vrefp 104 and the negative reference voltage Vrefm 106. In one example, bottom plate of a first capacitor (32C) in the array of MSB capacitors 114 is coupled to the positive reference voltage Vrefp 104 while bottom plates of remaining capacitors in the array of MSB capacitors 114 and in the array of LSB capacitors 112 are coupled to the negative reference voltage Vrefm 106.

An estimated DAC (digital to analog converter) voltage is a binary weighted sum of the positive reference voltage Vrefp 104 and the negative reference voltage Vrefm 106 applied at the bottom plates of the array of MSB capacitors 114 and bottom plates of the array of LSB capacitors 112. A weighted voltage is an error or a difference between the input voltage Vin 102 and the estimated DAC voltage. The weighted voltage is generated at an input of the zero crossing detector 120. The multiple cycles of the binary search technique further reduce the error in binary scaled steps. A 12 bit resolution SAR ADC requires 12 successive cycles to resolve the input voltage Vin 102 to a 12 bit digital output.

The zero crossing detector 120 compares the weighted voltage and a prefixed voltage to generate a digital output Dout 122. The prefixed voltage, in one example, is zero volt. The digital output Dout 122 includes information of the error between the input voltage Vin 102 and the estimated DAC voltage. The SAR state machine 124 receives the digital output Dout 122. On receiving the digital output Dout 122, the SAR state machine 124 generates the plurality of control signals 128. The plurality of control signals 128 activate the plurality of switches 126 such that bottom plates of the array of MSB capacitors 114 and bottom plates of the array of LSB capacitors 112 are coupled to one of the positive reference voltage Vrefp 104 and the negative reference voltage Vrefm 106. The capacitors in the array of MSB capacitors 114 are coupled to one of the positive reference voltage Vrefp 104 and the negative reference voltage Vrefm 106 in the first cycle based on the digital output Dout 122. The first capacitor (32C) in the array of MSB capacitors 114 is coupled to the positive reference voltage Vrefp 104 or the negative reference voltage Vrefm 106 based on the digital output Dout 122. A voltage (the positive reference voltage Vrefp 104 or the negative reference voltage Vrefm 106) provided to the first capacitor is fixed in the first cycle, and is not changed in the subsequent cycles of the binary search technique.

The first capacitor (32C) has a weightage that is half of an input range of the SAR ADC 100. If the input voltage Vin 102 is within the input range of the SAR ADC 100 and the zero crossing detector 120 makes a correct decision in the first cycle, the error will be less than half of the input range of the SAR ADC 100.

In a second cycle, the plurality of control signals 128 activate the plurality of switches 126 such that the bottom plates of the array of LSB capacitors 112 are coupled to the negative reference voltage Vrefm 106. The bottom plates of a first set of capacitors of the array of MSB capacitors 114 are coupled to the positive reference voltage Vrefp 104, and bottom plates of remaining capacitors of the array of MSB capacitors 114 are coupled to the negative reference voltage Vrefm 106 in response to the digital output Dout 122. In one version, a second capacitor (16C) in the array of MSB capacitors 114 is coupled to the positive reference voltage Vrefp 104 while bottom plates of remaining capacitors in the array of MSB capacitors 114 and in the array of LSB capacitors 112 are coupled to the negative reference voltage Vrefm 106.

The weighted voltage is generated at the input of the zero crossing detector 120. The zero crossing detector 120 compares the weighted voltage and the prefixed voltage to generate the digital output Dout 122. The SAR state machine 124 receives the digital output Dout 122. The second capacitor (16C) in the array of MSB capacitors 114 is coupled to the positive reference voltage Vrefp 104 or the negative reference voltage Vrefm 106 based on the digital output Dout 122. A voltage (the positive reference voltage Vrefp 104 or the negative reference voltage Vrefm 106) provided to the second capacitor is fixed in the second cycle, and is not changed in the subsequent cycles of the binary search technique. If the zero crossing detector 120 makes right decisions in the first cycle and the second cycle, the error will be less than one-fourth of the input range of the SAR ADC 100.

On receiving the digital output Dout 122, the SAR state machine 124 generates the plurality of control signals 128. The plurality of control signals 128 activate the plurality of switches 126 such that the bottom plates of the array of LSB capacitors 112 are coupled to the negative reference voltage Vrefm 106. The bottom plates of a second set of capacitors of the array of MSB capacitors 114 are coupled to the positive reference voltage Vrefp 104, and bottom plates of remaining capacitors of the array of MSB capacitors 114 are coupled to the negative reference voltage Vrefm 106 in response to the digital output Dout 122. In SAR ADC 100, a last capacitor in the array of MSB capacitors 114 has a capacitance of C which is 1/32 of a first capacitor whose capacitance is 32C. The last capacitor is coupled in response to the digital output Dout 122 to one of the positive reference voltage Vrefp 104 and the negative reference voltage Vrefm 106 in a sixth cycle of the binary search technique.

A value of the coupling capacitor Cc 116 is such that a first capacitor (32C) in the array of LSB capacitors 112 has a weightage which is half of a weightage of the last capacitor (C) in the array of MSB capacitors 114. Similarly, a second capacitor (16C) in the array of LSB capacitors 112 has a weightage which is half of the weightage of the first capacitor (32C) in the array of LSB capacitors 112. The binary search technique continues with a seventh cycle in which the first capacitor (32C) in the array of LSB capacitors 112 is coupled to one of positive reference voltage Vrefp 104 and the negative reference voltage Vrefm 106. In subsequent cycles of the binary search technique, a next capacitor in the array of LSB capacitors 112 is coupled to one of the positive reference voltage Vrefp 104 and the negative reference voltage Vrefm 106 based on the digital output Dout 122. This process continues until a requisite number of digital bits have been resolved, and the error is less than a required resolution of the SAR ADC 100.

The digital output Dout 122 generated is one bit output, and a series of these bits generated by the zero crossing detector 120 forms a digital representation of the input voltage Vin 102. When the SAR ADC 100 is a 12 bit SAR ADC, the digital representation of the input voltage Vin 102 is 12 bits generated by the zero crossing detector 120. Each switch of the plurality of switches 126 used in the SAR ADC 100 has an associated parasitic capacitance. Whenever, one of the input voltage Vin 102, the positive reference voltage Vrefp 104 and the negative reference voltage Vrefm 106 is provided to a switch, the parasitic capacitance is to be charged in addition to a capacitor (in the array of LSB capacitors 112 or in the array of MSB capacitors 114) coupled to the switch.

At the end of the conversion mode, the bottom plates of the array of MSB capacitors 114 and the bottom plates of the array of LSB capacitors 112 are coupled to one of the positive reference voltage Vrefp 104 and the negative reference voltage Vrefm 106. At the start of the a next sampling mode, all the bottom plates are coupled to the input voltage Vin 102 which cause charge to be transferred from the bottom plates to the input driver. This charge transfer or charge kick back results in a glitch in the input voltage Vin 102. In high-speed SAR ADCs, a sampling mode does not provide the input driver sufficient time to correct the glitch caused by the charge kick back. Thus, the input voltage Vin 102 will be degraded by the glitch which subsequently results in an error in the SAR ADC 100. A major impact in performance of the SAR ADC 100 is by a charge kick back which has a non-linear dependence on the input voltage Vin 102. Though, the array of LSB capacitors 112 have a total weightage which is half of a weightage of a smallest capacitor in the array of MSB capacitors 114, the parasitic capacitance caused by bottom plates of the array of LSB capacitors 112 is equivalent to the parasitic capacitance caused by bottom plates of the array of MSB capacitors 114. The charge kick back from the parasitic capacitance caused by bottom plates of array of LSB capacitors 112 is a major source of non-linear charge kick back.

Each switch of the plurality of switches 126 used in the SAR ADC 100 has a finite leakage current in the sampling mode, especially in advance CMOS technologies. This finite leakage current is dependent on the input voltage Vin 102 and is non-linear with amplitude of the input voltage Vin 102. This presents a non-linear loading of the input driver. When an amplifier such as pipeline residue gain stage is acting as an input driver, the finite leakage current degrades the DC gain and accuracy of the gain stage. Though, the array of LSB capacitors 112 have a total weightage which is half of a weightage of a smallest capacitor in the array of MSB capacitors 114, the array of LSB capacitors 112 causes as much leakage current as the array of MSB capacitors 114 thereby contributing significantly to the non-linear leakage current.

Figure 2:
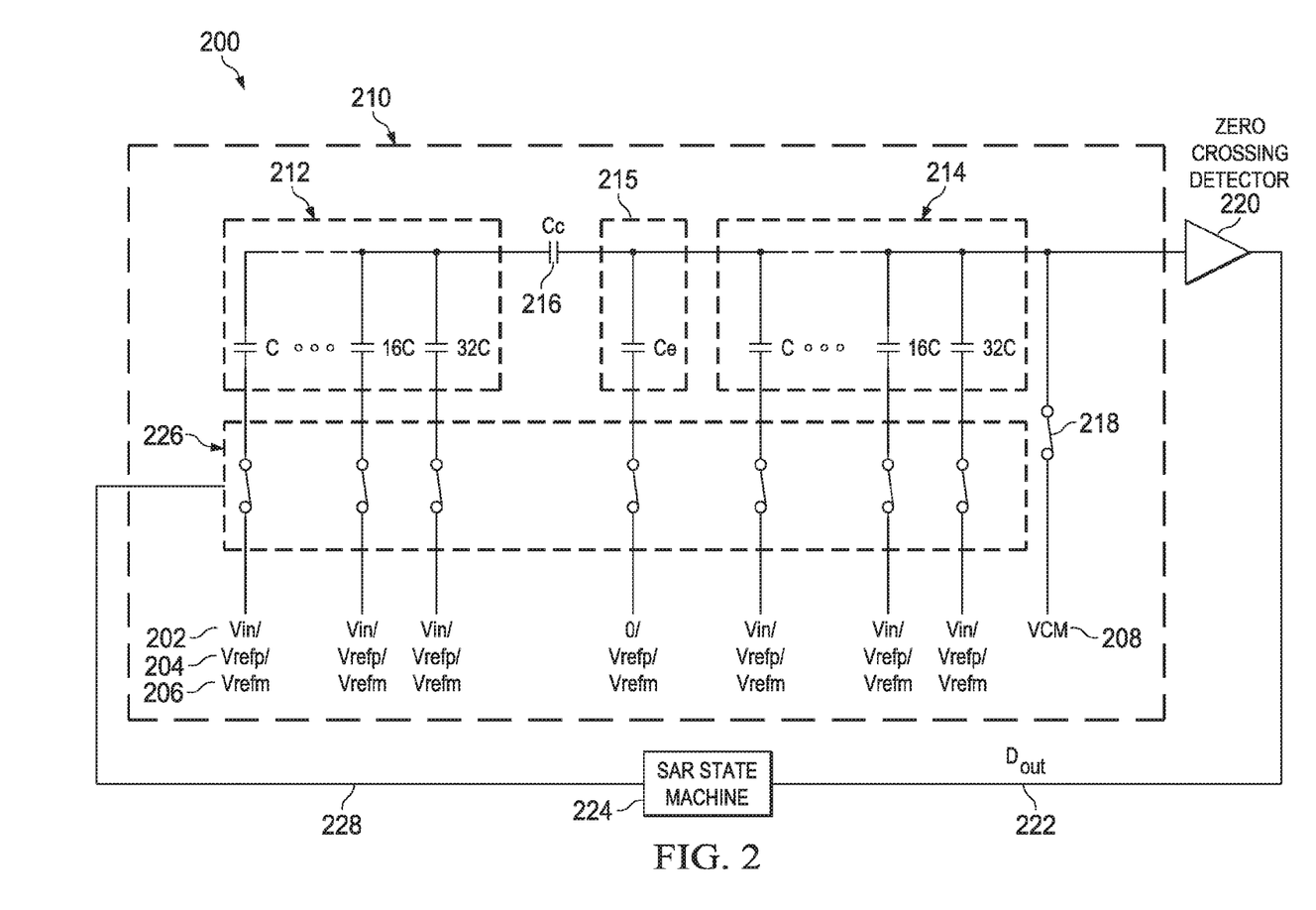
FIG. 2 illustrates a schematic of a successive approximation register analog to digital converter (SAR ADC)

FIG. 2 illustrates a schematic of a successive approximation register analog to digital converter (SAR ADC) 200. The SAR ADC 200 is one of a single ended SAR ADC and a differential SAR ADC. The SAR ADC 200 includes a charge sharing (digital to analog converter) DAC 210, a zero crossing detector 220 and a (successive approximation register) SAR state machine 224. The charge sharing DAC 210 includes an array of MSB (most significant bit) capacitors 214, an array of LSB (least significant bit) capacitors 212, a coupling capacitor Cc 216, an error correction capacitor Ce 215, a top plate switch 218 and a plurality of switches 226.

Each switch of the plurality of switches 226 receives an input voltage Vin 202, a positive reference voltage Vrefp 204 and a negative reference voltage Vrefm 206. An input driver, in one example, provides the input voltage Vin 202, and a reference driver provides the positive reference voltage Vrefp 204 and the negative reference voltage Vrefm 206. Each capacitor in the array of MSB capacitors 214 and the array of LSB capacitors 212 is coupled to a switch of the plurality of switches. The coupling capacitor Cc 216 is coupled between the array of LSB capacitors 212 and the array of MSB capacitors 214. The error correction capacitor Ce 215 is coupled to the coupling capacitor Cc 216. In one example, the error correction capacitor Ce 215 is placed between any two capacitors of the array of MSB capacitors 214 depending on a required range of error correction. In another example, multiple error correction capacitors are provided to provide error correction functionality at different stage of conversion of input voltage Vin 202.

The top plate switch 218 receives a common mode voltage Vcm 208. The top plate switch 218 is coupled to the zero crossing detector 220. The top plates of the array of MSB capacitors 214 and the error correction capacitor Ce 215 are also coupled to the zero crossing detector 220. The SAR state machine 224 is coupled to the zero crossing detector 220. The plurality of switches 226 are coupled to the SAR state machine 224.

The operation of the SAR ADC 200 illustrated in FIG. 2 is explained now. The SAR state machine 224 generates a plurality of control signals 228 which controls the plurality of switches 226. Each control signal of the plurality of control signals 228 activates a switch of the plurality of switches. Each switch of the plurality of switches 226 receives a control signal of the plurality of control signals 228 from the SAR state machine 224. Thus, each switch when activated by a control signal provides one of the input voltage Vin 202, the positive reference voltage Vrefp 204 and the negative reference voltage Vrefm 206 to a corresponding capacitor coupled to the switch.

The plurality of control signals 228 operate the charge sharing DAC in a sampling mode and a conversion mode. In the sampling mode, the top plate switch 218 is activated (closed). Thus, top plates of the array of MSB capacitors 214 and top plate of the error correction capacitor Ce 215 are coupled to the common mode voltage Vcm 208. The SAR state machine 224 generates the plurality of control signals 228 which couple bottom plates of the array of MSB capacitors 214 to the input voltage Vin 202, bottom plates of the array of LSB capacitors 212 to the input voltage Vin 202, and bottom plate of error correction capacitor Ce 215 to zero volt (0 volt). The error correction capacitor Ce 215 does not sample the input voltage Vin 202 as its function is to provide an additional range during the conversion mode.

The conversion mode is explained now. In the conversion mode, SAR ADC 200 finds a digital output Dout 222 equivalent to the input voltage Vin 202 using a binary search technique. The capacitors in the array of MSB capacitors 214 and in the array of LSB capacitors 212 are binary weighted capacitors. For example, a capacitance of the capacitors in each of the array of MSB capacitors 214 and the array of LSB capacitors are $32c$, $16C$ and so on to C. The binary search technique includes multiple cycles. In a first cycle, of the multiple cycles, the top plate switch 218 is inactivated. The SAR state machine 224 generates the plurality of control signals 228 which couple bottom plates of the array of MSB capacitors 214, bottom plates of the array of LSB capacitors 212 and bottom plate of the error correction capacitor Ce 215 to one of the positive reference voltage Vrefp 204 and the negative reference voltage Vrefm 206. In one example, bottom plate of a first capacitor ($32C$)

in the array of MSB capacitors 214 is coupled to the positive reference voltage Vrefp 204 while bottom plates of remaining capacitors in the array of MSB capacitors 214 and in the array of LSB capacitors 212 are coupled to the negative reference voltage Vrefm 206.

An estimated DAC (digital to analog converter) voltage is a binary weighted sum of the positive reference voltage Vrefp 204 and the negative reference voltage Vrefm 206 applied at the bottom plates of the array of MSB capacitors 214, bottom plates of the array of LSB capacitors 212 and bottom plate of the error correction capacitor Ce 215. A weighted voltage is an error or a difference between the input voltage Vin 202 and the estimated DAC voltage. The weighted voltage is generated at an input of the zero crossing detector 220. The multiple cycles of the binary search technique further reduce the error in binary scaled steps. A 12 bit resolution SAR ADC requires 12 successive cycles to resolve the input voltage Vin 202 to a 12 bit digital output.

The zero crossing detector 220 compares the weighted voltage and a prefixed voltage to generate a digital output Dout 222. The prefixed voltage, in one example, is zero volt. The digital output Dout 222 includes information of the error between the input voltage Vin 202 and the estimated DAC voltage. The SAR state machine 224 receives the digital output Dout 222. On receiving the digital output Dout 222, the SAR state machine 224 generates the plurality of control signals 228. The plurality of control signals 228 activate the plurality of switches 226 such that bottom plates of the array of MSB capacitors 214 and bottom plates of the array of LSB capacitors 212 are coupled to one of the positive reference voltage Vrefp 204 and the negative reference voltage Vrefm 206. The capacitors in the array of MSB capacitors 214 are coupled to one of the positive reference voltage Vrefp 204 and the negative reference voltage Vrefm 206 in the first cycle based on the digital output Dout 222. The first capacitor (32C) in the array of MSB capacitors 214 is coupled to the positive reference voltage Vrefp 204 or the negative reference voltage Vrefm 206 based on the digital output Dout 222. A voltage (the positive reference voltage Vrefp 204 or the negative reference voltage Vrefm 206) provided to the first capacitor is fixed in the first cycle, and is not changed in the subsequent cycles of the binary search technique.

The first capacitor (32C) has a weightage that is half of an input range of the SAR ADC 200. If the input voltage Vin 202 is within the input range of the SAR ADC 200 and the zero crossing detector 220 makes a correct decision in the first cycle, the error will be less than half of the input range of the SAR ADC 200.

In a second cycle, the plurality of control signals 228 activate the plurality of switches 226 such that the bottom plates of the array of LSB capacitors 212 are coupled to the negative reference voltage Vrefm 206. The bottom plate of the error correction capacitor Ce 215 is also coupled to the negative reference voltage Vrefm 206. The bottom plates of a first set of capacitors of the array of MSB capacitors 214 are coupled to the positive reference voltage Vrefp 204, and bottom plates of remaining capacitors of the array of MSB capacitors 214 are coupled to the negative reference voltage Vrefm 206 in response to the digital output Dout 222. In one version, a second capacitor (16C) in the array of MSB capacitors 214 is coupled to the positive reference voltage Vrefp 204 while bottom plates of remaining capacitors in the array of MSB capacitors 214 and in the array of LSB capacitors 212 are coupled to the negative reference voltage Vrefm 206.

The weighted voltage is generated at the input of the zero crossing detector 220. The zero crossing detector 220 compares the weighted voltage and the prefixed voltage to generate the digital output Dout 222. The SAR state machine 224 receives the digital output Dout 222. The second capacitor (16C) in the array of MSB capacitors 214 is coupled to the positive reference voltage Vrefp 204 or the negative reference voltage Vrefm 206 based on the digital output Dout 222. A voltage (the positive reference voltage Vrefp 204 or the negative reference voltage Vrefm 206) provided to the second capacitor is fixed in the second cycle, and is not changed in the subsequent cycles of the binary search technique. If the zero crossing detector 220 makes right decisions in the first cycle and the second cycle, the error will be less than one-fourth of the input range of the SAR ADC 200.

On receiving the digital output Dout 222, the SAR state machine 224 generates the plurality of control signals 228. The plurality of control signals 228 activate the plurality of switches 226 such that the bottom plates of the array of LSB capacitors 222 are coupled to the negative reference voltage Vrefm 206. The bottom plate of the error correction capacitor Ce 215 is coupled to the predefined voltage Vt. The bottom plates of a second set of capacitors of the array of MSB capacitors 214 are coupled to the positive reference voltage Vrefp 204, and bottom plates of remaining capacitors of the array of MSB capacitors 214 are coupled to the negative reference voltage Vrefm 206 in response to the digital output Dout 222. In SAR ADC 200, a last capacitor in the array of MSB capacitors 214 has a capacitance of C which is 1/32 of a first capacitor whose capacitance is 32C. The last capacitor is coupled in response to the digital output Dout 222 to one of the positive reference voltage Vrefp 204 and the negative reference voltage Vrefm 206 in a sixth cycle of the binary search technique.

If the zero crossing detector 220 makes right decisions until the sixth cycle, the error will be less than 1/32 of the input range of the SAR ADC 200. If the zero crossing detector does not make a right decision in the first six cycles, the error will be greater than 1/32 of the input range of the SAR ADC 200. This error will persist until the end of the conversion mode. The error correction capacitor Ce 215 provides a range of 1/32 of the input range of the SAR ADC 200. This is used to provide additional range to the SAR ADC 200 to correct for any errors by the zero crossing detector 220. This technique is referred as dynamic error correction, and it helps to reduce power consumption in the SAR ADC 200. It also enhances a conversion speed of the SAR ADC 200 by relaxing accuracy requirements of the zero crossing detector 220.

A size and a location of the error correction capacitor Ce 215 determines which decision of the zero crossing detector 220 is required to be corrected and to what extent. In SAR ADC 200, the error correction capacitor Ce 215 ensures that an error as large as 1/32 of the input range of the SAR ADC 200 in any one of the first six cycles can be corrected. In one version, multiple error correction capacitors are inserted in the SAR ADC 200. In SAR ADC 200, one of positive reference voltage Vrefp 204 and the negative reference voltage Vrefm 206 is applied to the bottom plate of the error correction capacitor Ce 215 based on the digital output Dout 222. This ensures that if the error is less than 1/32 of the input range of the SAR ADC 200, the error fits in a range provided by the following cycles.

A value of the coupling capacitor Cc 216 is such that a first capacitor (32C) in the array of LSB capacitors 212 has a weightage which is half of a weightage of the last capacitor (C) in the array of MSB capacitors 214. Similarly, a second capacitor (16C) in the array of LSB capacitors 212 has a weightage which is half of the weightage of the first capacitor (32C) in the array of LSB capacitors 212. The binary search technique continues in which the first capacitor (32C) in the array of LSB capacitors 212 is coupled to one of positive reference voltage Vrefp 204 and the negative reference voltage Vrefm 206. In subsequent cycles of the binary search technique, a next capacitor in the array of LSB capacitors 212 is coupled to one of the positive reference voltage Vrefp 204 and the negative reference voltage Vrefm 206 based on the digital output Dout 222. This process continues until a requisite number of digital bits have been resolved, and the error is less than a required resolution of the SAR ADC 200.

The digital output Dout 222 generated is one bit output, and a series of these bits generated by the zero crossing detector 220 forms a digital representation of the input voltage Vin 202. When the SAR ADC 200 is a 12 bit SAR ADC, the digital representation of the input voltage Vin 202 is 13 bits generated by the zero crossing detector 220. To get the final 12 bit digital representation, the additional digital bit associated with the dynamic error correction is provided adequate weightage and then subtracted from the digital code represented by the remaining 12 bits.

Each switch of the plurality of switches 226 used in the SAR ADC 200 has an associated parasitic capacitance. Whenever, one of the input voltage Vin 202, the positive reference voltage Vrefp 204 and the negative reference voltage Vrefm 206 is provided to a switch, the parasitic capacitance is to be charged in addition to a capacitor (in the array of LSB capacitors 212 or in the array of MSB capacitors 214) coupled to the switch.

At the end of the conversion mode, the bottom plates of the array of MSB capacitors 214, the bottom plates of the array of LSB capacitors 212 and the bottom plate of the error correction capacitor Ce 215 are coupled to one of the positive reference voltage Vrefp 204 and the negative reference voltage Vrefm 206. At the start of the a next sampling mode, all the bottom plates are coupled to the input voltage Vin 202 which cause charge to be transferred from the bottom plates to the input driver. This charge transfer or charge kick back results in a glitch in the input voltage Vin 202. In high-speed SAR ADCs, a sampling mode does not provide the input driver sufficient time to correct the glitch caused by the charge kick back. Thus, the input voltage Vin 202 will be degraded by the glitch which subsequently results in an error in the SAR ADC 200. A major impact in performance of the SAR ADC 200 is by a charge kick back which has a non-linear dependence on the input voltage Vin 202. Though, the array of LSB capacitors 212 have a total weightage which is half of a weightage of a smallest capacitor in the array of MSB capacitors 214, the parasitic capacitance caused by bottom plates of the array of LSB capacitor 212 is equivalent to the parasitic capacitance caused by bottom plates of the array of MSB capacitors 214. The charge kick back from the parasitic capacitance caused by bottom plates of array of LSB capacitors 212 is a major source of non-linear charge kick back.

Each switch of the plurality of switches 226 used in the SAR ADC 200 has a finite leakage current in the sampling mode, especially in advance CMOS technologies. This finite leakage current is dependent on the input voltage Vin 202 and is non-linear with amplitude of the input voltage Vin 202. The presents a non-linear loading of the input driver. When an amplifier such as pipeline residue gain stage is acting as an input driver, the finite leakage current degrades the DC gain and accuracy of the gain stage. Though, the array of LSB capacitors 212 have a total weightage which is half of a weightage of a smallest capacitor in the array of MSB capacitors 214, the array of LSB capacitors 212 causes as much leakage current as the array of MSB capacitors 214 thereby contributing significantly to the non-linear leakage current.

Figure 3:
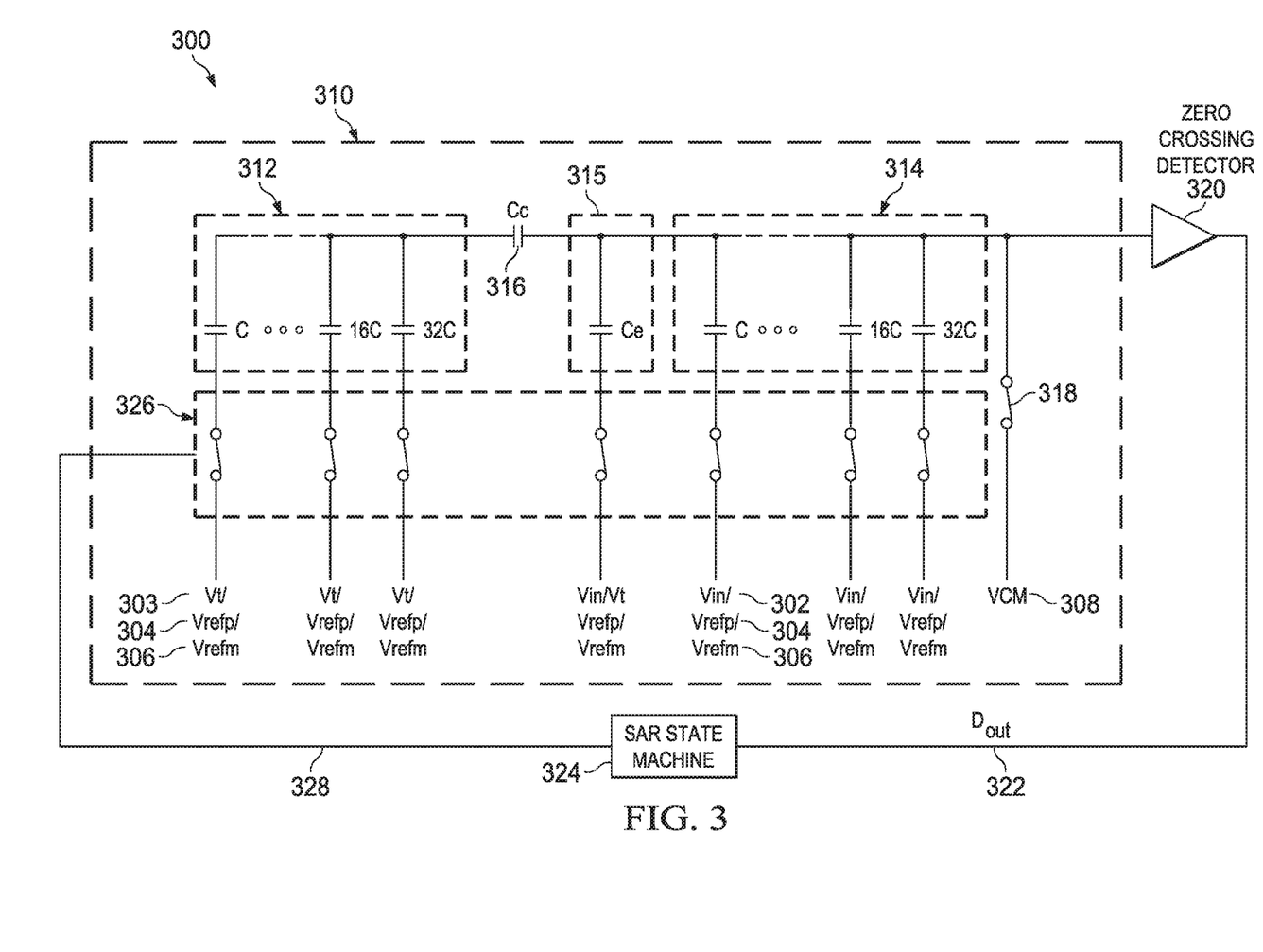
FIG. 3 illustrates a schematic of a successive approximation register analog to digital converter (SAR ADC), according to an embodiment.

FIG. 3 illustrates a schematic of a successive approximation register analog to digital converter (SAR ADC) 300, according to an embodiment. The SAR ADC 300 is one of a single ended SAR ADC and a differential SAR ADC. The SAR ADC 300 includes a charge sharing (digital to analog converter) DAC 310, a zero crossing detector 320 and a (successive approximation register) SAR state machine 324. The charge sharing DAC 310 includes an array of MSB (most significant bit) capacitors 314, an array of LSB (least significant bit) capacitors 312, a coupling capacitor Cc 316, an error correction capacitor Ce 315, a top plate switch 318 and a plurality of switches 326.

Each switch of the plurality of switches 326 receives an input voltage Vin 302, a positive reference voltage Vrefp 304 and a negative reference voltage Vrefm 306. An input driver, in one example, provides the input voltage Vin 302, and a reference driver provides the positive reference voltage Vrefp 304 and the negative reference voltage Vrefm 306. Each capacitor in the array of MSB capacitors 314 and the array of LSB capacitors 312 is coupled to a switch of the plurality of switches. The coupling capacitor Cc 316 is coupled between the array of LSB capacitors 312 and the array of MSB capacitors 314. The error correction capacitor Ce 315 is coupled to the coupling capacitor Cc 316 and the array of MSB capacitors 314. The error correction capacitor Ce 315 is placed in parallel to a last capacitor (C) in the array of MSB capacitors 314. The error correction capacitor Ce 315 is placed after the array of MSB capacitors 314 and is coupled to the coupling capacitor Cc 316. The values of the capacitors (32C, 16C to C) illustrated in the array of MSB capacitors 314 and the array of LSB capacitors 312 is exemplary, and is understood not to limit the scope of the present disclosure.

The top plate switch 318 receives a common mode voltage Vcm 308. The top plate switch 318 is coupled to the zero crossing detector 320. The top plates of the array of MSB capacitors 314 and the error correction capacitor Ce 315 are also coupled to the zero crossing detector 320. The SAR state machine 324 is coupled to the zero crossing detector 320. The plurality of switches 326 are coupled to the SAR state machine 324. The SAR ADC 300 may include one or more additional components known to those skilled in the relevant art and are not discussed here for simplicity of the description.

The operation of the SAR ADC 300 illustrated in FIG. 3 is explained now. The SAR state machine 324 generates a plurality of control signals 328 which controls the plurality of switches 326. Each control signal of the plurality of control signals 328 activates a switch of the plurality of switches. Each switch of the plurality of switches 326 receives a control signal of the plurality of control signals 328 from the SAR state machine 324. Thus, each switch when activated by a control signal provides one of the input voltage Vin 302, the positive reference voltage Vrefp 304 and the negative reference voltage Vrefm 306 to a corresponding capacitor coupled to the switch.

The plurality of control signals 328 operate the charge sharing DAC in a sampling mode and a conversion mode. In the sampling mode, the top plate switch 318 is activated (closed). Thus, top plates of the array of MSB capacitors 314 and top plate of the error correction capacitor Ce 315 are coupled to the common mode voltage Vcm 308. The SAR state machine 324 generates the plurality of control signals 328 which couple bottom plates of the array of MSB capacitors 314 and the error correction capacitor Ce 315 to the input voltage Vin 302. The bottom plates of the array of LSB capacitors 312 are coupled to a predefined voltage Vt 303. In one example, the predefined voltage Vt 303 is zero volt (0 volt). A weightage of the error correction capacitor Ce 315 is equal to a weightage of the array of LSB capacitors 312. Hence, sampling the input voltage Vin 302 on the error correction capacitor Ce 315 is similar to sampling the input voltage Vin 302 on the array of LSB capacitors 312. As compared to the SAR ADC 200, the SAR ADC 300 samples the input voltage Vin 302 on a smaller capacitor (the error correction capacitor Ce 315) instead of a large array of LSB capacitors 312.

The conversion mode is explained now. In the conversion mode, SAR ADC 300 finds a digital output Dout 322 equivalent to the input voltage Vin 302 using a binary search technique. The capacitors in the array of MSB capacitors 314 and in the array of LSB capacitors 312 are binary weighted capacitors. For example, a capacitance of the capacitors in each of the array of MSB capacitors 314 and the array of LSB capacitors are 32c, 16C and so on to C. The binary search technique includes multiple cycles. In a first cycle, of the multiple cycles, the top plate switch 318 is inactivated. The SAR state machine 324 generates the plurality of control signals 328 which couple bottom plates of the array of MSB capacitors 314, bottom plates of the array of LSB capacitors 312 and bottom plate of the error correction capacitor Ce 315 to one of the positive reference voltage Vrefp 304 and the negative reference voltage Vrefm 306. In one example, bottom plate of a first capacitor (32C) in the array of MSB capacitors 314 is coupled to the positive reference voltage Vrefp 304 while bottom plates of remaining capacitors in the array of MSB capacitors 314 and in the array of LSB capacitors 312 are coupled to the negative reference voltage Vrefm 306.

An estimated DAC (digital to analog converter) voltage is a binary weighted sum of the positive reference voltage Vrefp 304 and the negative reference voltage Vrefm 306 applied at the bottom plates of the array of MSB capacitors 314, bottom plates of the array of LSB capacitors 312 and bottom plate of the error correction capacitor Ce 315. A weighted voltage is an error or a difference between the input voltage Vin 302 and the estimated DAC voltage. The weighted voltage is generated at an input of the zero crossing detector 320. The multiple cycles of the binary search technique further reduce the error in binary scaled steps. A 12 bit resolution SAR ADC requires 12 successive cycles to resolve the input voltage Vin 302 to a 12 bit digital output.

The weightage of the error correction capacitor Ce 315 is equal to the weightage of the array of LSB capacitors 312 i.e. a voltage generated by the error correction capacitor Ce 315 at the input of the zero crossing detector 320 is equal to a voltage generated by the array of LSB capacitors 312 at the input of zero crossing detector 320 when a fixed voltage is applied to the error correction capacitor Ce 315 and the array of LSB capacitors 312 respectively.

The zero crossing detector 320 compares the weighted voltage and a prefixed voltage to generate a digital output Dout 322. The prefixed voltage, in one example, is zero volt. The digital output Dout 322 includes information of the error between the input voltage Vin 302 and the estimated DAC voltage. The SAR state machine 324 receives the digital output Dout 322. On receiving the digital output Dout 322, the SAR state machine 324 generates the plurality of control signals 328. The plurality of control signals 328 activate the plurality of switches 326 such that bottom plates of the array of MSB capacitors 314 and bottom plates of the array of LSB capacitors 312 are coupled to one of the positive reference voltage Vrefp 304 and the negative reference voltage Vrefm 306. The capacitors in the array of MSB capacitors 314 are coupled to one of the positive reference voltage Vrefp 304 and the negative reference voltage Vrefm 306 in the first cycle based on the digital output Dout 322. The first capacitor (32C) in the array of MSB capacitors 314 is coupled to the positive reference voltage Vrefp 304 or the negative reference voltage Vrefm 306 based on the digital output Dout 322. A voltage (the positive reference voltage Vrefp 304 or the negative reference voltage Vrefm 306) provided to the first capacitor is fixed in the first cycle, and is not changed in the subsequent cycles of the binary search technique.

The first capacitor (32C) has a weightage that is half of an input range of the SAR ADC 300. If the input voltage Vin 302 is within the input range of the SAR ADC 300 and the zero crossing detector 320 makes a correct decision in the first cycle, the error will be less than half of the input range of the SAR ADC 300.

In a second cycle, the plurality of control signals 328 activate the plurality of switches 326 such that the bottom plates of the array of LSB capacitors 312 are coupled to the negative reference voltage Vrefm 306. The bottom plate of the error correction capacitor Ce 315 is coupled to the predefined voltage Vt 303. The bottom plates of a first set of capacitors of the array of MSB capacitors 314 are coupled to the positive reference voltage Vrefp 304, and bottom plates of remaining capacitors of the array of MSB capacitors 314 are coupled to the negative reference voltage Vrefm 306 in response to the digital output Dout 322. In one version, a second capacitor (16C) in the array of MSB capacitors 314 is coupled to the positive reference voltage Vrefp 304 while bottom plates of remaining capacitors in the array of MSB capacitors 314 and in the array of LSB capacitors 312 are coupled to the negative reference voltage Vrefm 306.

The weighted voltage is generated at the input of the zero crossing detector 320. The zero crossing detector 320 compares the weighted voltage and the prefixed voltage to generate the digital output Dout 322. The SAR state machine 324 receives the digital output Dout 322. The second capacitor (16C) in the array of MSB capacitors 314 is coupled to the positive reference voltage Vrefp 304 or the negative reference voltage Vrefm 306 based on the digital output Dout 322. A voltage (the positive reference voltage Vrefp 304 or the negative reference voltage Vrefm 306) provided to the second capacitor is fixed in the second cycle, and is not changed in the subsequent cycles of the binary search technique. If the zero crossing detector 320 makes right decisions in the first cycle and the second cycle, the error will be less than one-fourth of the input range of the SAR ADC 300.

On receiving the digital output Dout 322, the SAR state machine 324 generates the plurality of control signals 328. The plurality of control signals 328 activate the plurality of switches 326 such that the bottom plates of the array of LSB capacitors 312 are coupled to the negative reference voltage Vrefm 306. The bottom plate of the error correction capacitor Ce 315 is coupled to the predefined voltage Vt 303. The bottom plates of a second set of capacitors of the array of MSB capacitors 314 are coupled to the positive reference voltage Vrefp 304, and bottom plates of remaining capacitors of the array of MSB capacitors 314 are coupled to the negative reference voltage Vrefm 306 in response to the digital output Dout 322. In SAR ADC 300, a last capacitor in the array of MSB capacitors 314 has a capacitance of C which is 1/32 of a first capacitor whose capacitance is 32C. The last capacitor is coupled in response to the digital output Dout 322 to one of the positive reference voltage Vrefp 304 and the negative reference voltage Vrefm 306 in a sixth cycle of the binary search technique.

If the zero crossing detector 320 makes right decisions until the sixth cycle, the error will be less than 1/32 of the input range of the SAR ADC 300. If the zero crossing detector does not make a right decision in the first six cycles, the error will be greater than 1/32 of the input range of the SAR ADC 300. This error will persist until the end of the conversion mode. The error correction capacitor Ce 315 provides a range of 1/32 of the input range of the SAR ADC 300. This is used to provide additional range to the SAR ADC 300 to correct for any errors by the zero crossing detector 320. This technique is referred as dynamic error correction, and it helps to reduce power consumption in the SAR ADC 300. It also enhances a conversion speed of the SAR ADC 300 by relaxing accuracy requirements of the zero crossing detector 320.

A location of the error correction capacitor Ce 315 js after the last and smallest capacitor in the array of MSB capacitors 314. The weightage of the error correction capacitor Ce 315 is equal to the weightage of the array of LSB capacitors 312. This allows the input voltage Vin 302 to be sampled on the error correction capacitor Ce 315 instead of the array of LSB capacitors 312. This location of the error correction capacitor Ce 315 ensures that an error in any one of the first six cycles can be corrected. Also, it covers for any errors in the preceding cycles. In one version, multiple error correction capacitors are inserted in the SAR ADC 300.

A value of the coupling capacitor Cc 316 is such that a first capacitor (32C) in the array of LSB capacitors 312 has a weightage which is half of a weightage of the last capacitor (C) in the array of MSB capacitors 314. Similarly, a second capacitor (16C) in the array of LSB capacitors 312 has a weightage which is half of the weightage of the first capacitor (32C) in the array of LSB capacitors 312. The binary search technique continues in which the first capacitor (32C) in the array of LSB capacitors 312 is coupled to one of positive reference voltage Vrefp 304 and the negative reference voltage Vrefm 306. In subsequent cycles of the binary search technique, a next capacitor in the array of LSB capacitors 312 is coupled to one of the positive reference voltage Vrefp 304 and the negative reference voltage Vrefm 306 based on the digital output Dout 322. This process continues until a requisite number of digital bits have been resolved, and the error is less than a required resolution of the SAR ADC 300.

The digital output Dout 322 generated is one bit output, and a series of these bits generated by the zero crossing detector 320 forms a digital representation of the input voltage Vin 302. When the SAR ADC 300 is a 12 bit SAR ADC, the digital representation of the input voltage Vin 302 is 13 bits generated by the zero crossing detector 320. To get the final 12 bit digital representation, the additional digital bit associated with the dynamic error correction is provided adequate weightage and then subtracted from the digital code represented by the remaining 12 bits.

Each switch of the plurality of switches 326 used in the SAR ADC 300 has an associated parasitic capacitance. Whenever, one of the input voltage Vin 302, the positive reference voltage Vrefp 304 and the negative reference voltage Vrefm 306 is provided to a switch, the parasitic capacitance is to be charged in addition to a capacitor (in the array of LSB capacitors 312 or in the array of MSB capacitors 314) coupled to the switch. Since, the input voltage Vin 302 is not provided to the array of LSB capacitors 312 and instead, the input voltage Vin 302 is provided to the error correction capacitor Ce 315, the effect of parasitic capacitance is significantly reduced in SAR ADC 300 as compared to the SAR ADC 100. The non-linear component of the charge kickback is also significantly lower in SAR ADC 300 compared to SAR ADC 100.

Each switch of the plurality of switches 326 used in the SAR ADC 300 has a finite leakage current in the sampling mode, especially in advance CMOS technologies. This finite leakage current is dependent on the input voltage Vin 302 and is non-linear with amplitude of the input voltage Vin 302. Since, the input voltage Vin 302 is not provided to the array of LSB capacitors 312 in the SAR ADC 300, this does not cause loading of the input driver. When an amplifier such as pipeline residue gain stage is acting as an input driver, the DC gain and accuracy of the gain stage for SAR ADC 300 is better than SAR ADC 100. Thus, the technique of not sampling the input voltage Vin 302 on the array of LSB capacitors 312 reduces non-linear capacitive load and the finite leakage current significantly in the SAR ADC 300 as compared to the SAR ADC 100.

In one embodiment, the error correction capacitor Ce 315 is not present in the SAR ADC 100. However, the operation remains similar as discussed above such that the input voltage Vin 302 is not provided to the array of LSB capacitors 312.

Figure 4:
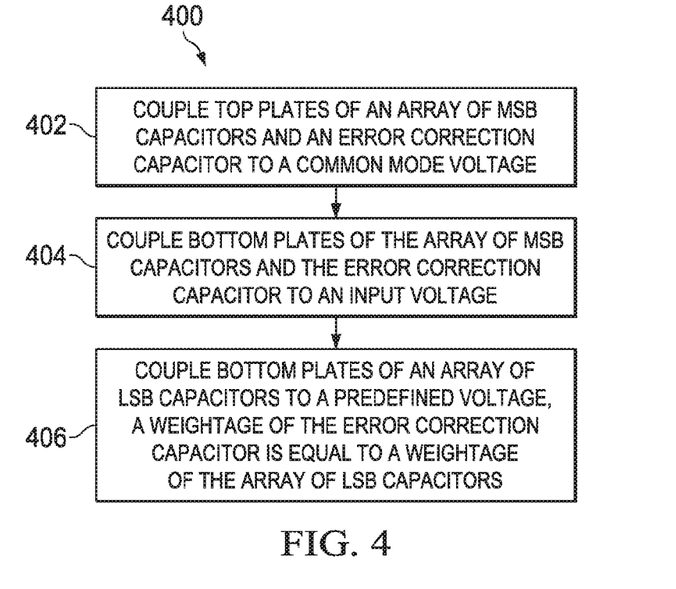
FIG. 4 is a flowchart illustrating a method according to an embodiment.

FIG. 4 is a flowchart 400 illustrating a method, according to an embodiment. The flowchart 400 is explained in connection with the SAR ADC 300. At step 402, top plates of an array of MSB capacitors and an error correction capacitor are coupled to a common mode voltage. In SAR ADC 300, top plates of the array of MSB capacitors 314 and top plate of the error correction capacitor Ce 315 are coupled to the common mode voltage Vcm 308. At step 404, bottom plates of the array of MSB capacitors and the error correction capacitor are coupled to an input voltage. A coupling capacitor is coupled between the array of MSB capacitors and the array of LSB capacitors. The error correction capacitor is coupled to the array of MSB capacitors and the coupling capacitor.

The bottom plates of an array of LSB capacitors are coupled to a predefined voltage, at step 406. In one example, the predefined voltage is zero volt (0 volt). Thereafter, the top plates of the array of MSB capacitors and the error correction capacitor are coupled to a zero crossing detector. The bottom plates of the array of MSB capacitors, the error correction capacitor and the array of LSB capacitors are coupled to one of a positive reference voltage and a negative reference voltage. A weighted voltage is generated at an input of the zero crossing detector. The zero crossing detector compares the weighted voltage and the prefixed voltage.

The weighted voltage is an error or a difference between the input voltage and an estimated DAC voltage. The estimated DAC (digital to analog converter) voltage is a binary weighted sum of the positive reference voltage and the negative reference voltage applied at the bottom plates of the array of MSB capacitors, bottom plates of the array of LSB capacitors and bottom plate of the error correction capacitor. A weightage of the error correction capacitor is equal to a weightage of the array of LSB capacitors i.e. a voltage generated by the error correction capacitor at the input of the zero crossing detector is equal to a voltage generated by the array of LSB capacitors at the input of zero crossing detector when a fixed voltage is applied to the error correction capacitor and the array of LSB capacitors respectively.

Figure 5:
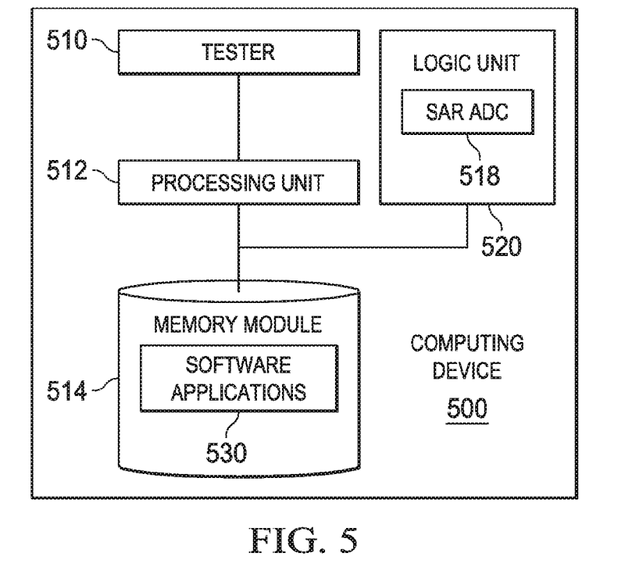
FIG. 5 illustrates a computing device, according to an embodiment.

FIG. 5 illustrates a computing device 500, according to an embodiment. The computing device 500 is, or is incorporated into, a mobile communication device, such as a mobile phone, a personal digital assistant, a transceiver, a personal computer, or any other type of electronic system. The computing device 500 may include one or more additional components known to those skilled in the relevant art and are not discussed here for simplicity of the description.

In some embodiments, the computing device 500 comprises a megacell or a system-on-chip (SoC) which includes a processing unit 512 such as a CPU (Central Processing Unit), a memory module 514 (e.g., random access memory (RAM)) and a tester 510. The processing unit 512 can be, for example, a CISC-type (Complex Instruction Set Computer) CPU, RISC-type CPU (Reduced Instruction Set Computer), or a digital signal processor (DSP).

The memory module 514 (which can be memory such as RAM, flash memory, or disk storage) stores one or more software applications 530 (e.g., embedded applications) that, when executed by the processing unit 512, performs any suitable function associated with the computing device 500. The tester 510 comprises logic that supports testing and debugging of the computing device 500 executing the software applications 530.

For example, the tester 510 can be used to emulate a defective or unavailable component(s) of the computing device 500 to allow verification of how the component(s), were it actually present on the computing device 500, would perform in various situations (e.g., how the component(s) would interact with the software applications 530). In this way, the software applications 530 can be debugged in an environment which resembles post-production operation.

The processing unit 512 typically comprises memory and logic which store information frequently accessed from the memory module 514. The computing device 500 includes a logic unit 520. The logic unit is coupled to the processing unit 512 and the memory module 514. The logic unit includes a SAR ADC 518. The SAR ADC 518 is similar in connection and operation to the SAR ADC 300. The SAR ADC 518 includes a charge sharing (digital to analog converter) DAC, a zero crossing detector and a (successive approximation register) SAR state machine. The charge sharing DAC includes an array of MSB (most significant bit) capacitors, an array of LSB (least significant bit) capacitors, a coupling capacitor, an error correction capacitor, a top plate switch and a plurality of switches.

In SAR ADC 518, an input voltage is not sampled on the array of LSB capacitors and instead, the input voltage is provided to the error correction capacitor. This reduces the parasitic capacitance significantly as compared to the SAR ADC 100. A finite leakage current associated with the plurality of switches is dependent on the input voltage and is non-linear with amplitude of the input voltage. Since, the input voltage is not provided to the array of LSB capacitors in the SAR ADC 518, this does not cause loading of an input driver. The input driver provides the input voltage. When an amplifier such as pipeline residue gain stage is acting as an input driver, the DC gain and accuracy of the gain stage for SAR ADC 518 is better than SAR ADC 100. Thus, the technique of not sampling the input voltage on the array of LSB capacitors reduces non-linear capacitive load and the finite leakage current significantly in the SAR ADC 518 as compared to the SAR ADC 100.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A successive approximation register analog to digital converter (SAR ADC) comprising a charge sharing DAC (digital to analog converter), the charge sharing DAC comprising:
   an array of MSB (most significant bit) capacitors;
   an array of LSB (least significant bit) capacitors;
   a coupling capacitor coupled between the array of MSB capacitors and the array of LSB capacitors;
   an error correction capacitor coupled to the array of MSB capacitors and the coupling capacitor; and
   a top plate switch coupled to the array of MSB capacitors, the top plate switch configured to receive a common mode voltage.

2. The SAR ADC of claim 1 further comprising:
   a zero crossing detector coupled to the charge sharing DAC and the top plate switch, the zero crossing detector configured to generate a digital output; and
   a successive approximation register (SAR) state machine coupled to the zero crossing detector.

3. The SAR ADC of claim 2, wherein the charge sharing DAC further comprises "÷"
   a plurality of switches, each switch of the plurality of switches is coupled to a capacitor in the array of MSB capacitors and in the array of LSB capacitors.

4. The SAR ADC of claim 3, wherein the SAR state machine is configured to generate a plurality of control signals, each control signal of the plurality of control signals is configured to activate a switch of the plurality of switches.

5. The SAR ADC of claim 4, wherein each switch is activated by a control signal of the plurality of control signals, and each switch is configured to receive one of an input voltage, a positive reference voltage and a negative reference voltage.

6. The SAR ADC of claim 2, wherein the SAR state machine is configured to operate the charge sharing DAC in a sampling mode and a conversion mode, wherein during the sampling mode the input voltage is provided to the array of MSB capacitors and the error correction capacitor.

7. The SAR ADC of claim 6, wherein during the sampling mode:
   top plate switch is activated such that top plates of the array of MSB capacitors and the error correction capacitor are coupled to the common mode voltage;
   bottom plates of the array of MSB capacitors and the error correction capacitor are coupled to the input voltage; and
   bottom plates of the array of LSB capacitors are coupled to a predefined voltage.

8. The SAR ADC of claim 6, wherein during the conversion mode:
   top plate switch is inactivated;
   bottom plates of the array of MSB capacitors, the error correction capacitor and the array of LSB capacitors are coupled to one of the positive reference voltage and the negative reference voltage, wherein a weighted voltage is generated at an input of the zero crossing detector;

the zero crossing detector is configured to generate the
digital output on comparing the weighted voltage and a
prefixed voltage; and the SAR state machine is configured to receive the digital
output.

9. The SAR ADC of claim 8, wherein the weighted voltage is a difference between the input voltage and an estimated DAC (digital to analog converter) voltage, the estimated DAC voltage is a binary weighted sum of the positive reference voltage and the negative reference voltage applied at the bottom plates of the array of MSB capacitors, bottom plates of the array of LSB capacitors and bottom plate of the error correction capacitor.

10. The SAR ADC of claim 1, wherein a weightage of the error correction capacitor is equal to a weightage of the array of LSB capacitors.

11. The SAR ADC of claim 1, wherein during the conversion mode:
bottom plates of the array of LSB capacitors are coupled to the negative reference voltage;
bottom plate of the error correction capacitor is coupled to the predefined voltage;
bottom plates of a first set of capacitors of the array of MSB capacitors are coupled to the positive reference voltage in response to the digital output and bottom plates of remaining capacitors of the array of MSB capacitors are coupled to the negative reference voltage in response to the digital output;
the zero crossing detector is configured to compare the weighted voltage and the prefixed voltage to generate the digital output; and
the SAR state machine is configured to generate a plurality of control signals to couple the bottom plates of a second set of capacitors of the array of MSB capacitors to the positive reference voltage in response to the digital output and to couple the bottom plates of remaining capacitors of the array of MSB capacitors to the negative reference voltage in response to the digital output.

12. A method of converting an input voltage to a digital output in a SAR ADC (successive approximation register analog to digital converter) comprising:
coupling top plates of an array of MSB capacitors and an error correction capacitor to a common mode voltage;
coupling bottom plates of the array of MSB capacitors and the error correction capacitor to an input voltage; and
coupling bottom plates of an array of LSB capacitors to a predefined voltage.

13. The method of claim 12 further comprising:
coupling the top plates of the array of MSB capacitors and the error correction capacitor to a zero crossing detector;
coupling bottom plates of the array of MSB capacitors, the error correction capacitor and the array of LSB capacitors to one of a positive reference voltage and a negative reference voltage, wherein a weighted voltage is generated at an input of the zero crossing detector;
comparing the weighted voltage and a prefixed voltage to generate a digital output.

14. The method of claim 13, wherein the weighted voltage is a difference between the input voltage and an estimated DAC (digital to analog converter) voltage, the estimated DAC voltage is a binary weighted sum of the positive reference voltage and the negative reference voltage applied at the bottom plates of the array of MSB capacitors, bottom plates of the array of LSB capacitors and bottom plate of the error correction capacitor.

15. The method of claim 12 further comprising:
coupling the bottom plates of the array of LSB capacitors to the negative reference voltage;
coupling the bottom plate of the error correction capacitor to the predefined voltage;
coupling bottom plates of a first set of capacitors of the array of MSB capacitors to a positive reference voltage and coupling bottom plate of remaining capacitors of the array of MSB capacitors to the negative reference voltage in response to the digital output;
comparing the weighted voltage and the prefixed voltage to generate the digital output; and
coupling bottom plates of a second set of capacitors of the array of MSB capacitors to the positive reference voltage in response to the digital output and coupling bottom plates of remaining capacitors of the array of MSB capacitors to the negative reference voltage in response to the digital output.

16. The method of claim 12, wherein a coupling capacitor is coupled between the array of MSB capacitors and the array of LSB capacitors, the error correction capacitor is coupled to the array of MSB capacitors and the coupling capacitor.

17. The method of claim 12, wherein a weightage of the error correction capacitor is equal to a weightage of the array of LSB capacitors.

18. A computing device comprising:
a processing unit;
a memory module coupled to the processing unit; and
a logic unit coupled to the processing unit and the memory module, the logic unit comprising a SAR ADC, the SAR ADC comprising a charge sharing DAC (digital to analog converter), the charge sharing DAC comprising:
an array of MSB (most significant bit) capacitors;
an array of LSB (least significant bit) capacitors;
a coupling capacitor coupled between the array of MSB capacitors and the array of LSB capacitors;
an error correction capacitor coupled to the array of MSB capacitors and the coupling capacitor; and
a top plate switch coupled to the array of MSB capacitors, the top plate switch configured to receive a common mode voltage.

19. The computing device of claim 18, wherein the SAR ADC further comprises:
a zero crossing detector coupled to the charge sharing DAC and the top plate switch, the zero crossing detector configured to generate a digital output; and
a successive approximation register (SAR) state machine coupled to the zero crossing detector.

20. The computing device of claim 18, wherein a weightage of the error correction capacitor is equal to a weightage of the array of LSB capacitors.

* * * * *

UNITED STATES PATENT AND TRADEMARK OFFICE
CERTIFICATE OF CORRECTION

| | |
|---|---|
| PATENT NO. | : 9,647,676 B2 |
| APPLICATION NO. | : 15/206433 |
| DATED | : May 9, 2017 |
| INVENTOR(S) | : Raghu Nandan Srinivasa and Tharun Nagulu |

Page 1 of 1

It is certified that error appears in the above-identified patent and that said Letters Patent is hereby corrected as shown below:

On the Title Page

Below Item (65) insert:
--(30) Foreign Application Priority Data
May 15, 2015 (IN) ..... 2469/CHE/2015--

Signed and Sealed this
Twenty-seventh Day of February, 2018

Andrei Iancu
*Director of the United States Patent and Trademark Office*